United States Patent [19]

Finegan et al.

[11] 4,385,946
[45] May 31, 1983

[54] RAPID ALTERATION OF ION IMPLANT DOPANT SPECIES TO CREATE REGIONS OF OPPOSITE CONDUCTIVITY

[75] Inventors: Sean N. Finegan, Aberdeen; James H. McFee, Colts Neck; Robert G. Swartz, Highlands; Alexander M. Voshchenkov, Freehold, all of N.J.

[73] Assignee: Bell Telephone Laboratories, Incorporated, Murray Hill, N.J.

[21] Appl. No.: 275,418

[22] Filed: Jun. 19, 1981

[51] Int. Cl.³ ............... H01L 21/203; H01L 21/263
[52] U.S. Cl. ........................... 148/175; 148/1.5; 148/187; 250/492.2; 250/492.3; 357/91
[58] Field of Search ................ 148/1.5, 175, 187; 250/492.2, 492.3; 357/91

[56] References Cited

U.S. PATENT DOCUMENTS

| | | | |
|---|---|---|---|
| 3,520,741 | 7/1970 | Mankarious | 148/175 |
| 4,086,108 | 4/1978 | Gonda | 148/1.5 |
| 4,133,702 | 1/1979 | Krimmel | 148/1.5 |
| 4,140,546 | 2/1979 | Krimmel | 148/1.5 |
| 4,149,084 | 4/1979 | Arndt et al. | 250/492 A |
| 4,179,312 | 12/1979 | Keller et al. | 148/1.5 |
| 4,187,124 | 2/1980 | Muller et al. | 148/1.5 |
| 4,226,648 | 10/1980 | Goodwin et al. | 148/175 |

OTHER PUBLICATIONS

Naganuma et al., Appl. Phys. Letts. 27 (1975) 342.
Ota, Y., J. Appl. Phys. 51 (1980) 1102.
Bean et al., Electrochem. Soc. Meeting, Boston, Mass. 1979, p. 334.

*Primary Examiner*—Upendra Roy

[57] ABSTRACT

A molecular beam epitaxial method of fabricating a semiconductor device is disclosed wherein the dopant is implanted by establishing a plasma containing ions of the dopant and the ions are coupled through a drift chamber to impinge on the growing substrate surface. The plasma formed in the ion gun has ions of boron and arsenic and therefore the dopants selected for implantation can be determined by setting a mass filter present in the ion gun. A change to the dopant of the opposite conductivity type can be accomplished in seconds by simply readjusting the mass filter in the ion gun.

7 Claims, 3 Drawing Figures

ION SOURCE

RAPID ALTERATION OF ION IMPLANT DOPANT SPECIES TO CREATE REGIONS OF OPPOSITE CONDUCTIVITY

FIELD OF THE INVENTION

This invention relates to semiconductor processing and, more particularly, to semiconductor processing wherein the dopants are placed into the semiconductor by ion implantation.

BACKGROUND OF THE INVENTION

Silicon molecular beam epitaxy (MBE) is a technique for low temperature growth of single crystal silicon epitaxial layers in an ultra-high vacuum station. One system that has been used for silicon MBE processing is disclosed by Y. Ota in the article entitled "Silicon Molecular Beam Epitaxy with Simultaneous Ion Implant Doping," *Journal of Applied Physics,* Vol. 51 (2), February 1980, pp. 1102–1110. In the Ota system, a high purity source of silicon is evaporated by an electron beam and the evaporated silicon deposits as single crystal epitaxy on a heated silicon substrate. In order to create devices that are useful, the silicon epitaxy is usually doped with p-type or n-type impurities. In the Ota system, an ion gun generates ions of the required dopant and this dopant is coupled through a drift chamber to the growth chamber in which the silicon deposition takes place. As a result, very low energy dopant ion implantation is coincident with the process of growing an epitaxial layer. By using ion implant doping the number of stray dopant atoms is reduced from other prior art techniques wherein the dopant was simply evaporated in order to deposit on the growing substrate. Fewer dopant atoms are introduced into the growth chamber because the sticking coefficient of the implanted dopant is much higher than that of an evaporated dopant. An additional advantage in ion implant doping is that the dopant ion beam density can be monitored and controlled during the epitaxial growth.

In the system disclosed by Ota, arsenic ions from an arsenic plasma are developed by the ion gun and propelled through the drift chamber to the growing epitaxial substrate thereby establishing an n-type dopant in the silicon substrate. There is no suggestion in the Ota article as to how one might establish a p-type dopant in the growing epitaxial layers. One technique that would be apparent to those skilled in the art is to simply terminate growth of the epitaxial structure while a different plasma consisting of a p-type dopant is established in the ion gun. It is desirable that growth should be suspended for a minimal length of time when converting from one dopant source to another since when growth is suspended, ambient oxygen, carbon and other contaminants accumulate on the sample surface thereby providing a source of crystalline disruption for any subsequent epitaxial growth. These defects in the crystal structure are known to impair the operation of the semiconductor device and also to result in a decreased minority-carrier lifetime. It is therefore desirable to change from one type of conductivity to another in as short a period as possible with as little disruption in growth as possible.

SUMMARY OF THE INVENTION

This invention is based on the discovery that a mixed plasma can be created in the ion gun with ions from elements that result in opposite conductivities. By using a method described hereinafter, a plasma can be created in the ion gun with ions of both arsenic and boron simultaneously present in the plasma. As a result, a mass analyzer present at the output of the ion gun can be used to rapidly select either arsenic or boron as the ions to be implanted in the scanned regions (either layers or areas) of the growing silicon epitaxial layer.

The present inventive method can be practiced in the apparatus previously disclosed by Ota. In this apparatus a silicon source is evaporated by an electron gun in order to deposit single crystal on a heated silicon substrate. Doping is accomplished by coupling the ions from a low energy ion gun through to the growing silicon epitaxial layer. A plasma of boron ions is first established in the ion gun by admitting $BF_3$ gas to the ion chamber which is ionized by electrons emitted from the hot filament contained therein. The $B^+$ species of ion current is monitored and maximized by adjusting the gas pressure. After the system has had time to stabilize, a solid arsenic charge is moved into the ion gun into closer proximity to the hot filament. Insertion of the arsenic probe is done very slowly in a stepwise manner to allow gradual heating of the arsenic. If the arsenic charge is inserted too rapidly, the $B^+$ species of ion will vanish. The arsenic ion current can be detected with an appropriate setting of the mass analyzer and final beam optimization is accomplished by again adjusting the $BF_3$ gas inlet pressure. The mass filter can then be adjusted to select one of the ions extracted from the plasma and this ion can then be coupled through to the growing silicon epitaxial layer. At any point in time after a predetermined growth with doping using the selected ion, the mass analyzer in the ion gun can be readjusted to select the other ion and growth of a layer with opposite conductivity can be continued in a matter of seconds.

BRIEF DESCRIPTION OF THE DRAWING

The invention will be more readily understood after reading the following detailed description in conjunction with the drawing wherein.

DETAILED DESCRIPTION

Figure 1:
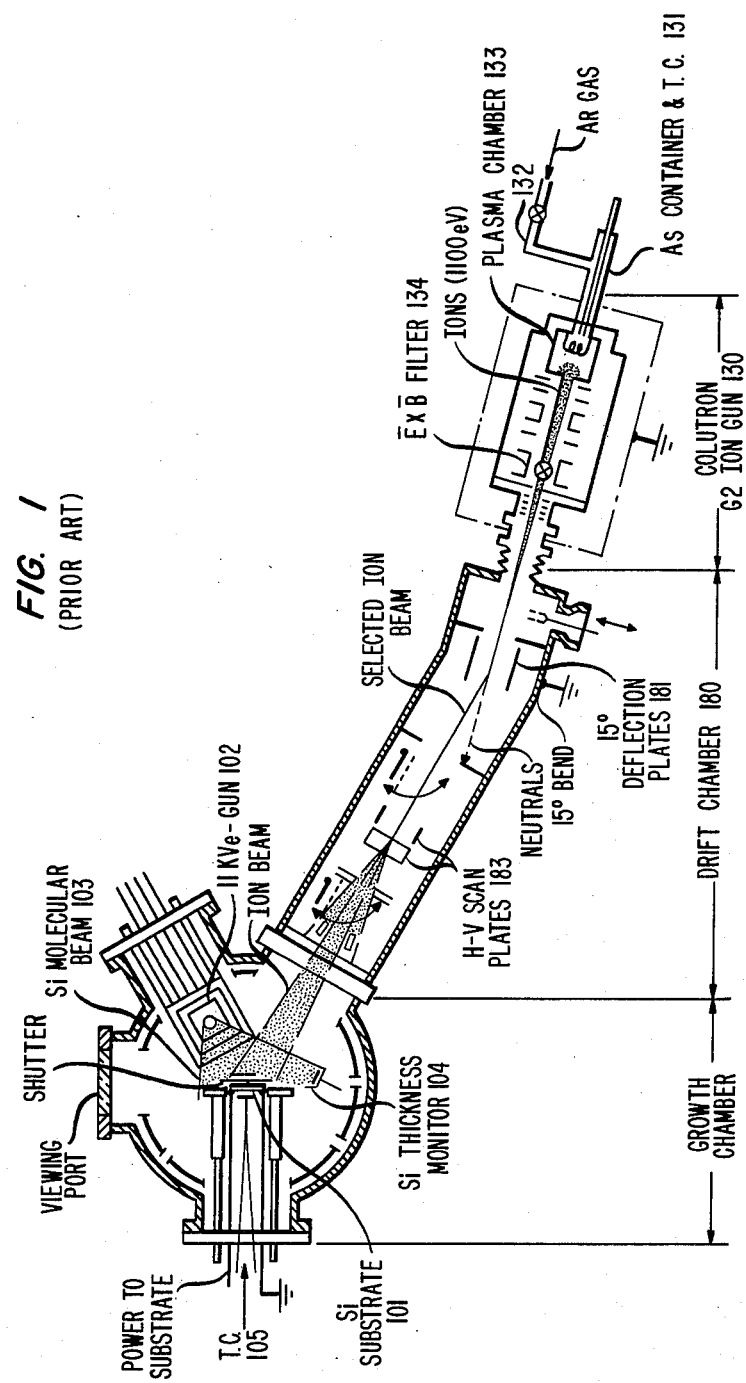
FIG. 1 is a cross sectional view of prior art apparatus that may be utilized to practice the present invention.

The epitaxial growth system disclosed by Ota in the above-identified article is shown in cross-sectional form in FIG. 1. In this system, an atomically clean silicon substrate 101 is positioned in a growth chamber and resistively heated by power that is externally coupled to the substrate. The growth chamber also includes an 11 kV electron gun 102 that is directed toward a silicon source located 15 cm from the substrate to create a silicon molecular beam 103 that is, in turn, directed toward substrate 101. Liquid nitrogen shrouds surround the e-gun unit and the substrate heating unit. A portion of the silicon molecular beam 103 is deposited onto the silicon substrate 101 and the rest is deposited on silicon beam collectors (not shown). A silicon thickness monitor 104 is positioned to measure the thickness of the deposited silicon. A thermocouple 105 is attached to a reflector located behind the substrate to monitor the substrate temperature. The thermocouple reading is used to measure substrate temperatures below 750 degrees C at which the pyrometric measurement is not accurate.

The ion implantation system consists of two major sections, an ion gun 130 and an ion beam drift chamber 180. The ion gun 130 is a commercially available ion gun which can be purchased from the Colutron Corporation as a model G-2 low energy ion gun system. This ion gun has a stainless steel cavity into which a charge of solid arsenic can be inserted. This stainless steel cavity may also include an encapsulated thermocouple to monitor the cavity temperature and a gas port or tube 132 into which Ota coupled argon gas for the purpose of controlling the arsenic ions. The solid arsenic charge can be inserted into a plasma chamber 133 which is electrically heated, and the resulting ions are coupled through a mass analyzer or mass filter 134 to the output of ion gun 130.

Mass filter 134 contains crossed electrostatic and magnetic fields. Ions are deflected to one side of the filter by the electric field, and to the other side by the magnetic field. Only if the ions pressure the proper ratio of electronic charge to molecular mass will the action of the fields balance, permitting the ions to pass unimpeded through the filter.

The ions out of the ion gun 130 are coupled into the drift chamber 180 where they are deflected by 15 degrees around the bend in the drift chamber by deflection plates designated as 181 in FIG. 1. The mass filter 134 in ion gun 130 is not capable of rejecting non-ionized material and these neutrals are filtered out by the bend because they continue in a straight line and deposit on the walls of the drift chamber. The ion beam deflected by the deflection plates 181 is coupled through high voltage scan plates 183 which can be used to position the selected ion beam on the surface of substrate 101.

Figure 2:
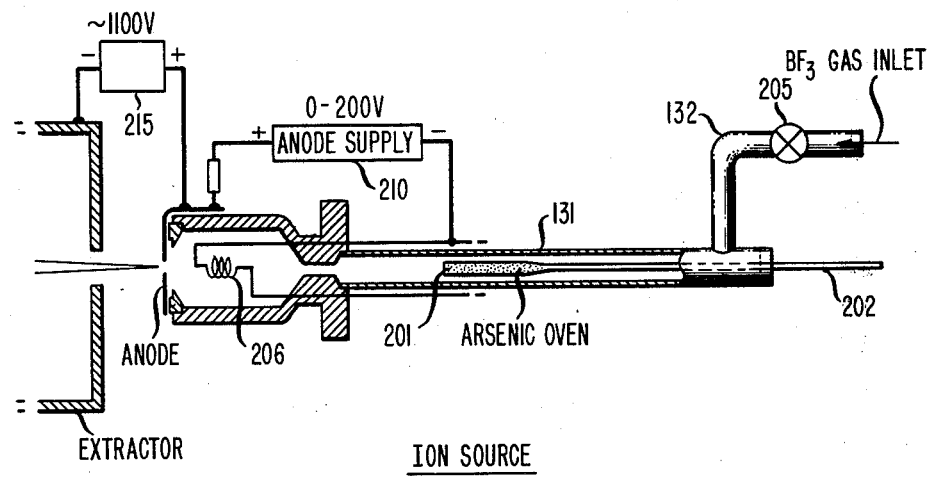
FIG. 2 is a cross sectional diagram of the ion source from FIG. 1 when used to practice the present invention.

As indicated in FIG. 1, Ota used this apparatus to implant arsenic ions into the growing epitaxial layer on a silicon substrate. In accordance with the present invention, the gas port of the tube 132 normally used to couple argon gas into the plasma chamber is instead used to couple boron trifluoride (BF$_3$) into the plasma chamber as shown in FIG. 2. As indicated in FIG. 2, the ionization chamber of the apparatus in FIG. 1 is essentially unmodified, but it is used to generate a plasma containing both B$^+$ and As$^+$ dopant species. A solid arsenic charge 201 is contained in the hollow end of a moveable stainless steel rod 202. The boron source is BF$_3$ gas that is 99.5 percent pure. This gas is coupled by way of a tube 132 into the same chamber as the arsenic charge. Initially the arsenic charge is retracted and the arsenic vapor contained in the ionization chamber is at a minimum. Valve 205 is opened to permit the BF$_3$ gas to flow into the chamber and be ionized by electrons emitted from the hot filament 206 which dissipates about 270 watts. The inlet pressure of the BF$_3$ gas is adjusted to be about 40–50 millitorr. The pressure in the ionization chamber is somewhat less. An arc discharge is struck when the anode voltage provided by anode supply 210 is equal to about 80–100 volts. The species present in the plasma at this point in time are B$^+$, BF$^+$, F$^+$ and BF$_2^+$ as determined by mass analysis. The B$^+$ species ion current is monitored and maximized by adjusting the BF$_3$ gas pressure. The optimal BF$_3$ inlet pressure has been determined to be about 20–30 millitorr.

After the system has had time to stabilize, the arsenic probe is slowly advanced toward the ionization chamber into closer proximity to the hot filament 206. Simultaneously the anode supply voltage from anode supply 210 is adjusted in order to maintain the plasma discharge. Insertion of the arsenic probe is done very slowly in a stepwise manner to allow gradual heating of the arsenic. When sufficient arsenic vapor pressure has built up in the ionization chamber, an arsenic ion current is detected with the appropriate setting of mass filter 134. Inasmuch as an increase in the As$^+$ current is accompanied by a decrease in the B$^+$ current, the B$^+$ species will vanish if the arsenic charge is overheated. At an optimum setting, the arsenic temperature was determined to be equal to about 300 degrees C. Final beam optimization is accomplished by again adjusting the BF$_3$ gas inlet pressure. The following table lists typical measured ion beam current for arsenic and boron ion beams by themselves and in combination with plasma of the complimentary species.

| Species | Beam current |
| --- | --- |
| As$^+$ | 218 nA |
| As$^+$ (As + BF$_3$) | 110 nA |
| B$^+$ (BF$_3$) | 58 nA |
| B$^+$ (As + BF$_3$) | 26 nA |

The ion extraction voltage provided by power supply 215 was equal to about 1100 volts and the decelerator voltage in the ion gun was set at 500 volts resulting in a final beam energy of about 600 electron volts from the ion gun. The beam currents specified in the table were measured at a target that was placed 130 cm from the exit of the ion gun final lens.

Figure 3:
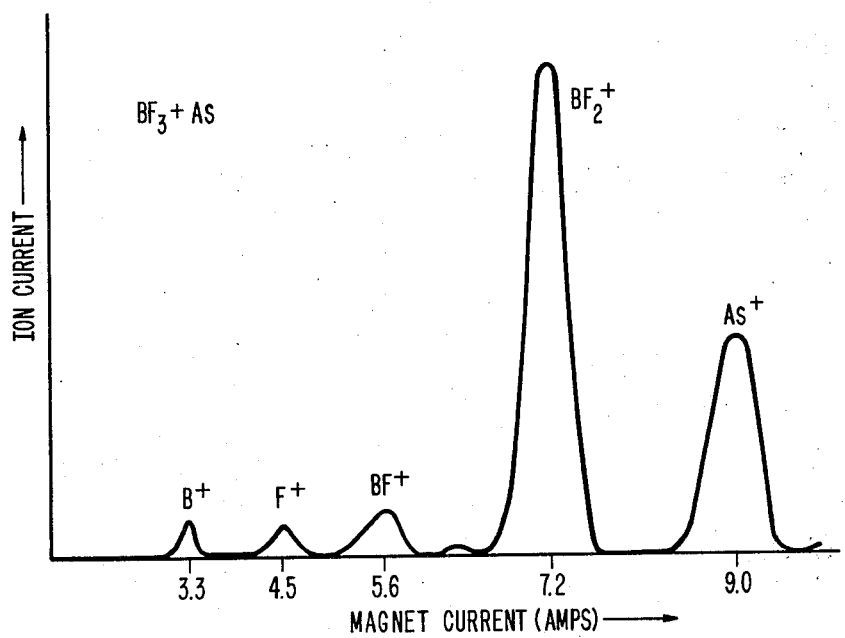
FIG. 3 is a plot of ion current versus magnet current in the mass filter showing each of the species of ion generated in the embodiment constructed to practice the present invention.

The amount of ion current obtained out of ion gun 130 by varying the magnetic field in the mass filter 134 while maintaining the electric field constant is set forth in FIG. 3. As indicated in FIG. 3, with an electric field potential of 200 volts in the mass filter, an ion current of B$^+$ can be obtained by setting the magnet current to 3.3 amps. Similarly, an ion beam of As$^+$ can be obtained by setting the magnet unit at 9.0 amps. Accordingly, after the ion beam has been focused and optimized for a particular dopant, the complimentary species may be selected in a matter of seconds merely by adjusting the magnet current in mass filter 134.

The above-described method has been used to construct a bipolar transistor using molecular beam epitaxial growth without any diffusion process. Collector, base and emitter layers were grown on an arsenic doped substrate. The epitaxial structure was doped N$^+$-P-N using the technique described hereinabove. The epitaxial layer with N doping was grown first by coupling the As$^+$ ions through to the substrate. The mass filter was then adjusted to select the B$^+$ ions and the p-type layer was grown. Finally, an N$^+$ layer was grown by readjusting the mass filter to reject the B$^+$ ions and select the As$^+$ ions.

It should be readily apparent to those skilled in the art that the present invention can be used equally as well to fabricate areas of different conductivity on a substrate surface. The scanning plates 183 of the drift chamber 180 can be adjusted to scan only one area of the substrate surface while the ion of one of the dopants is coupled through the mass filter. Subsequently a different ion can be coupled through the mass filter and the scanning plate 183 in the drift chamber 180 can be adjusted to couple these ions through to a different area of the substrate surface.

In addition, it should also be apparent to those skilled in the art that the dopant sources can be in other physical forms, i.e., both can be gaseous, both solid charges or other combinations, including liquid sources.

What is claimed is:

1. A method of fabricating a semiconductor device having at least two regions of opposite conductivity by implanting ions generated in an ion gun and coupled through a mass filter comprising the steps of creating a plasma in said ion gun having ions consisting of at least two elements which provide dopants of opposite conductivity in said semiconductor device, adjusting the mass filter to couple the ions of one of said two elements to a first region of said semiconductor device, and readjusting the mass filter to couple the second one of said two elements to a second region of said semiconductor device.

2. A method of fabricating a semiconductor device as defined in claim 1 wherein the step of creating a plasma in said ion gun comprises the steps of flowing a gas containing one of said two elements into the ion gun to establish a plasma having ions of one of the elements present in said gas, and slowly advancing a solid charge containing a second one of said two elements into said ion gun to establish a plasma that includes ions of an element present in said solid charge.

3. A method of fabricating a semiconductor device as defined in claim 2 wherein said gas is primarily boron trifluoride and said solid charge is primarily arsenic.

4. In a molecular beam epitaxial process of fabricating a semiconductor device by depositing silicon on a silicon substrate and implanting the silicon with ions generated in an ion gun and coupled to the substrate through a mass filter, the method of creating at least two layers of opposite conductivity comprising the steps of, creating a plasma in said ion gun having ions consisting of at least two elements which provide dopants of opposite conductivity in said semiconductor device, adjusting the mass filter to couple the ions of one of said two elements during the growth of a first layer in said semiconductor device, and readjusting the mass filter to couple the second one of said two elements during the growth of a second layer in said semiconductor device.

5. In a molecular beam epitaxial process of fabricating a semiconductor device as defined in claim 4 wherein the step of creating a plasma in said ion gun includes the steps of inserting one of said two elements into said ion gun to establish a plasma containing ions of said one of two elements, and slowly inserting the second one of two elements into said ion chamber to establish a plasma containing ions of the second one of said two elements.

6. In a molecular beam epitaxial process of fabricating a semiconductor device as defined in claim 4 wherein the step of creating a plasma in said ion gun includes the steps of flowing a gas including said one of said two elements into said ion gun so as to establish a plasma containing ions of said one of said two elements, and slowly inserting a solid charge of said second one of said two elements into said ion gun so as to establish a plasma containing ions of the second one of said two elements.

7. In a molecular beam epitaxial process of fabricating a semiconductor device as defined in claim 6 wherein the gas is primarily boron triflouride and the solid charge consists primarily of arsenic.

* * * * *